United States Patent [19]

Ferguson et al.

[11] Patent Number: 5,394,609
[45] Date of Patent: Mar. 7, 1995

[54] METHOD AND APPARATUS FOR MANUFACTURE OF PRINTED CIRCUIT CARDS

[75] Inventors: Mark E. Ferguson; Kenneth J. Guskie; Leon S. Nguyen, all or Charlotte; Joseph D. Poole, Troutman; Stuart L. Young, Charlotte; Simon Yu, Concord, all of N.C.

[73] Assignee: International Business Machines, Corporation, Armonk, N.Y.

[21] Appl. No.: 142,997

[22] Filed: Oct. 26, 1993

[51] Int. Cl.⁶ .............................................. H05K 3/34
[52] U.S. Cl. .............................. 29/840; 228/180.21; 228/180.22
[58] Field of Search ...................... 228/180.22, 180.21; 29/840, 832

[56] References Cited

U.S. PATENT DOCUMENTS

| | | | |
|---|---|---|---|
| 4,582,245 | 4/1986 | Cartwright | 228/180.21 |
| 4,779,877 | 10/1988 | Shaw | 279/9 |
| 4,860,439 | 8/1989 | Riley | 29/741 |

OTHER PUBLICATIONS

IBM Technical Disclosure Bulletin vol. 19 No. 4 Sep. 1976, pp. 1178–1179 by V. D. Coombs et al.
IBM Technical Disclosure Bulletin vol. 26 No. 11 Apr. 1984 "Workpiece Holder", R. H. Hagen, R. E. Koppstein and R. J. Reis, pp. 6128–6129.
27535 "Workboard Holder For Flexible Circuitry" Disclosed anonymously, Reproduced by Research Disclosure, Mar. 1987, No. 275.
IBM Technical Disclosure Bulletin vol. 17 No. 1 Jun. 1974 "Wafer Chuck", R. H. Brunner, p. 84.
IBM Technical Disclosure Bulletin vol. 20 No. 3 Aug. 1977 "Heat Sinking Wafer Gripper" G. M. Greenstein and F. Simms, p. 949.

Primary Examiner—Carl J. Arbes
Attorney, Agent, or Firm—Richard M. Goldman

[57] ABSTRACT

Disclosed is a method of populating printed circuit boards with surface mount technology devices in a multi-board work board holder. The method includes the steps placing the printed circuit boards into a multi-board work board holder having a plurality of apertures corresponding to the individual printed circuit boards. The multi-board work board holder is placed onto a surface mount technology production line, and solder paste is selectively applied onto contact pads on surfaces of the printed circuit boards. Integrated circuit chips are next placed onto the solder paste bearing surface of the printed circuit boards, with the contact leads of the integrated circuit chips bearing on deposited solder paste. The printed circuit boards and the work board holder are heated to the reflow temperature of the solder. The x-y plane and z axis coefficients of thermal expansion of the multi-board work board holder are matched to the x-y plane and z-axis coefficients of thermal expansion of the printed circuit boards to avoid warpage and misalignment of the printed circuit boards.

15 Claims, 11 Drawing Sheets

METHOD AND APPARATUS FOR MANUFACTURE OF PRINTED CIRCUIT CARDS

FIELD OF THE INVENTION

This disclosure relates to PCMCIA cards and more particularly to the fabrication of PCMCIA cards. PCMCIA cards are manufactured in a solder paste process where the printed circuit board is heated to cure the solder paste carrier and thereafter reflow the solder. This necessitates heating the printed circuit board to at least the reflow temperature of the solder. The reflow temperature of the solder is high enough above ambient temperature to cause warpage of the card, misalignment of the surface mount devices and the circuitization, and, in severe cases, delamination of the printed circuit board or card. The disclosed method and apparatus avoid warpage, misalignment, and delamination of the printed circuit board during reflow heating while using the thermal expansion to aid in fabricating the printed circuit cards.

BACKGROUND OF THE INVENTION

"PCMCIA" stands for the Personal Computer Memory Card International Association. PCMCIA cards, element 1 in FIGS. 1, 2, 3, and 4, are the "credit card" peripherals used as memory cards, including DRAM, SRAM, ROM, and PROM cards, modem-fax cards, mini-hard drive cards, terminal emulator cards, and the like. They are built to a PCMCIA standard. The PCMCIA standard sets the electrical, mechanical, and interface requirements for PCMCIA cards.

The small size of PCMCIA cards is intended to meet the form factor demands of portable computers. These small cards are approximately the size of a plastic credit card (54.0 mm by 85.6 mm) but several times thicker (Type I PCMCIA cards are 3.3 mm thick, Type II PCMCIA cards are 5 mm thick). It should be noted that, as used herein, Type I and Type II refer to the PCMCIA form and fit type standards, and not to the method of surface mount device attachment. PCMCIA cards are described in, for example, R. C. Alford, "Under The Hood: The PCMCIA Redefines Portability", *Byte Magazine*, December 1992, pp. 237–242; by Ken Ueltzen "Pushing The Packaging Envelope", *Circuit Assembly*, March 1992, pp. 32–35, and Richard Nass, "IC-Card Spec Adapts I/O To Memory Card Slot," *Electronic Design*, Jan. 22, 1992, pp. 45–57.

A PCMCIA card is shown in FIG. 1, a partial cutaway view of a PCMCIA card, with the top cover removed, is shown in FIG. 2, a cutaway side elevation of a PCMCIA card is shown in FIG. 3, and an exploded view of a PCMCIA card is shown in FIG. 4. The perspective views of a PCMCIA card show the top cover on 11 and off, and the 68 contact interface connector 21. FIG. 2 shows a PCMCIA card opened up without a top cover, to show the IC chips., and FIG. 3 shows a side elevation in cutaway with the PCMCIA's interface 21, the cover-frame assembly 31, an optional insulator sheet 41, and a printed circuit board 23 populated with IC chips 25 on both sides. The card 1 has a top cover 11, a frame 31, a printed circuit board 23, and a bottom cover 15.

To be noted is that the contacts 21 (standard PCMCIA) are at one end of the PCMCIA card 1 and the printed circuit card 23. According to the now current PCMCIA Standard 2, this is a 68 contact strip, with a width of 2 inches. The card 1 itself is 3.3 millimeters thick from top cover 11 to bottom cover 15, with the top cover 11 and bottom cover 15 having a total combined thickness of just 0.4 millimeters. This allows 2.9 millimeters of thickness for a populated, double sided, printed circuit card 23.

The height limitations of Type I cards, 3.3 mm, requires the use of low profile technologies, for example, either tape automated bonding (TAB) or card-on-board (COB) packaging technologies, both with specially designed low height IC chips 25, as TSOP IC chips 25. The thin, small outline package (TSOP) IC chip 25, with a height of 1.2 mm (0.047 inch), is particularly desirable for double sided Type I PCMCIA cards 1. Its low profile allows population of both sides of the PCMCIA printed circuit card 23 as shown in FIG. 3.

In an alternative IC chip technology a paper thin small outline package (PTSOP) having a height of just 0.5 mm (0.020 inch) is utilized, allowing two printed circuit cards 23 to be carried in a single PCMCIA card package 1. The lead pitch for TSOP IC chips is 0.5 mm (0.019 inch). Memory printed circuit cards are populated with 0.019 inch to 0.025 inch lead pitch IC chips, with approximately 1000 solder joints per printed circuit card 23. The surface mount technology required for the printed circuit boards 23 in Type I PCMCIA cards 1 comprises the steps of screen or stencil printing the solder paste onto the raw printed circuit card 23, chip 25 placement, and reflow.

The standard process flow is shown in FIG. 5.

The fine pitch requirements noted above, combined with fast cycle times, mandate automated cleaning of the solder paste stencil or screen, as well as solder paste deposition forms and patterns for proper solder joint formation. The fine pitch also requires that solder paste dispensing must be precisely controlled to avoid both solder bridging and solder gaps. The fine pitch further requires special handling of the in-process printed circuit boards in the critical interval between IC chip placement and solder reflow to avoid movement, misalignment, and misregistration of the SMT IC chips, which are held in place solely by the tackiness of the solder paste carrier.

The placement equipment required for placing TSOP IC chips 25 onto a high circuit density printed circuit card 23 requires high accuracy. In populating PCMCIA cards tape and reel is a preferred method used to supply properly aligned chips and devices, although pick and place tooling is also used for placement, as are machine vision robotic tools.

Reflow is carried out in a conveyorized system to avoid contamination or movement of devices.

Testing of populated cards 23 is driven by the number of leads, the pitch, and the interconnect density. Typically testing is performed through the edge connectors, e.g., the 68 contact PCMCIA standard interface 21, by boundary testing devices, although "bed of nails" testers can be utilized.

While the general process flow of the prior art used for PCMCIA fabrication is shown in FIG. 5 for a chip directly attached to a circuitized board, it is to be noted that Tape Automated Bonding (TAB) and Chip-On-Board (COB) joining may also be used in PCMCIA cards. In COB joining aluminum wire bonding is used. This avoids the high temperatures associated with gold wire bonding. After wire bonding a thermally curable epoxy glob top is placed atop the chip.

The PCMCIA standard specifies standards for the card controller and the card device driver. The PCMCIA card controller standard, without pin numbers, is shown in FIG. 6. This shows the contact names and functions of the host interface, the contact names and functions of the PCMCIA card interface, and the components, names, and functions of the PCMCIA card controller.

The PCMCIA standard further specifies aspects of the operating system, BIOS, and device driver interfaces. These are shown in FIG. 7.

The high functionality per unit area results in a high circuit density and a very high wiring density, demanding precise alignment and registration maintenance throughout the manufacturing process. Maintenance of alignment and registration, combined with one or two solder reflow thermal processing steps requires special package designs, fabrication equipment, and fabrication processes.

Thus a need exists for efficient manufacturing apparatus and processes that avoid thermally induced damage to in-process cards and boards.

SUMMARY OF THE INVENTION

The deficiencies of the prior art are overcome by the method and apparatus of the invention. According to a preferred embodiment of the invention there is provided a method of populating a plurality of printed circuit boards 23 with surface mount technology devices in a multi-board work board holder 101. The process includes the steps of selectively applying solder paste onto contact pads on a surface of the printed circuit boards 23 followed by placing the integrated circuit chips 25 onto the solder paste bearing surface of the printed circuit boards 23, with the contacts of the integrated circuit chips 25 bearing on the deposited solder paste. The printed circuit boards 23 and the work board holder are heated from ambient temperature to the reflow temperature of the solder to reflow the solder in the solder paste and provide electrical and mechanical connection between the integrated circuit chips 25 and the printed circuit boards. This is followed by cooling the printed circuit boards 23 and the multi-board work board holder 101 from the reflow temperature of the solder to a lower temperature. According to one embodiment of the invention the x-y plane and the z axis coefficients of thermal expansion of the multi-board work board holder 101 are matched to the x-y plane and z-axis coefficients of thermal expansion of the printed circuit boards. This is to avoid warpage and misalignment of the printed circuit boards.

According to a further embodiment of the invention the surface mount manufacturing process is carried out with a multi-board work board holder 101 system having a work board holder 101, a loading fixture 151 for placing and holding a printed circuit board in a lockable position in the work board holder 101, and a hold down lock 131 for locking printed circuit boards 23 in the work board holder 101.

The multi-board work board holder 101 has first apertures 103 corresponding to in-process printed circuit boards 23 and second apertures 105 corresponding to the hold down locks 131. The hold down locks are resilient 131 spring members, having a "V" shape. The sides, 133, 133', of the "V" 131 extend upward through the lock apertures 105 of the work board holder 101, with obtuse angle extensions, 135, 135', on the upper ends of the "V" 131. The obtuse angle extensions 135, 135', are substantially parallel to the work board holder 101 when the "V" 131 is normally expanded and form an angle with the work board holder 101 when the "V" 131 is compressed. The "V" 131 has an aperture 137 on its lower end for movably engaging one of the plug extensions 153 of the workboard holder. The locking fixture 151 is a base plate 155 having finger like extensions, 153, corresponding to the hold down locks 131, and adapted to (1) compress the sides, 133, 133', of the "V" 131 and lift the extensions, 135, 135', of the "V" when engaged and (2) allow expansion of the sides, 133, 133', of the "V" and allow contact of the extensions, 135, 135', of the "V" with the surface of the work board holder 101 when disengaged.

According to a still further embodiment of the invention, the coefficient of the thermal expansion of the substrate differs from the coefficient of thermal expansion of the interconnection 21, and this mismatch is utilized to effect joining. Specifically, a further embodiment of the invention provides a method of attaching the relatively high coefficient of thermal expansion electrical connector interface 21 to the relatively low coefficient of thermal expansion printed circuit board 23. This is accomplished following selectively applying solder paste onto contact pads on a surface of the printed circuit board 23, placing integrated circuit chips 25 onto the solder paste bearing surface of the printed circuit board 23, with contact leads of the integrated circuit chips 25 bearing on deposited solder paste, and during heating of the printed circuit board 23 from ambient temperature to the reflow temperature of the solder to reflow the solder in the solder paste and provide electrical and mechanical connection between the integrated circuit chips 25 and the printed circuit boards 23. Specifically the method of interface 21 attachment utilizes an insert defined by extensions, 29, 29', of the printed circuit board material in the relatively low coefficient of thermal expansion printed circuit board 23. This insert 27 is wider then the relatively high coefficient of thermal expansion electrical connector interface 21. According to this embodiment of the invention the relatively high coefficient of thermal expansion electrical connector interface 21 is positioned in the insert between the extensions of the printed circuit board material in the relatively low coefficient of thermal expansion printed circuit board 23. This is done when the units are placed in the work board holder 101, that is, before application of solder paste and before placement of the SMT IC chips 25. Then, when the printed circuit board is heated from ambient temperature to the reflow temperature of the solder to reflow the solder in the solder paste, the relatively high coefficient of thermal expansion electrical connector interface 21 expands to a greater extent then the relatively low coefficient of thermal expansion printed circuit board 23. This results in a thermal expansion fit the electrical connector interface 21 to the printed circuit board 23.

THE FIGURES

The invention may be understood by reference to the FIGURES appended hereto.

DETAILED DESCRIPTION OF THE INVENTION

The deficiencies of the prior art are overcome by the thermal management based manufacturing apparatus and methods of the invention.

Control of Misalignment and Warpage

Figure 1:
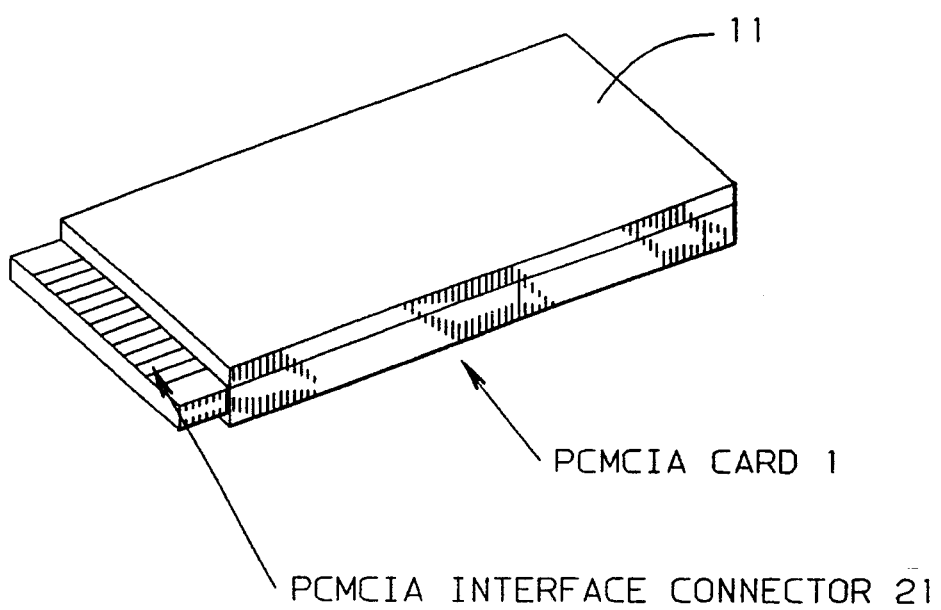
FIG. 1 shows a perspective view of a PCMCIA card with the PCMCIA interface connector.
Figure 2:
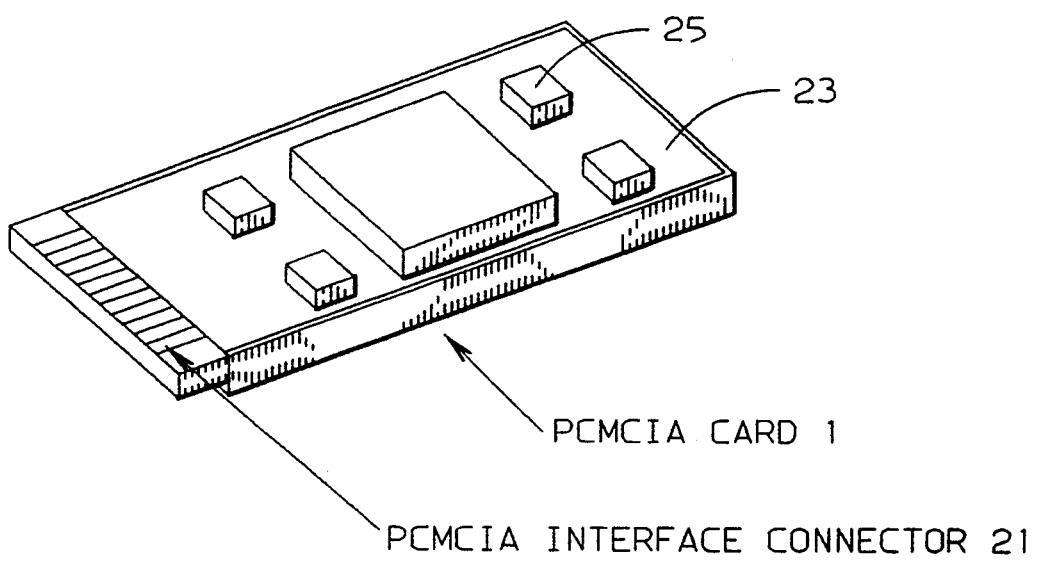
FIG. 2 shows a perspective view of the PCMCIA card of FIG. 1 with the top cover removed to show the populated printed circuit card inside the PCMCIA card.
Figure 3:
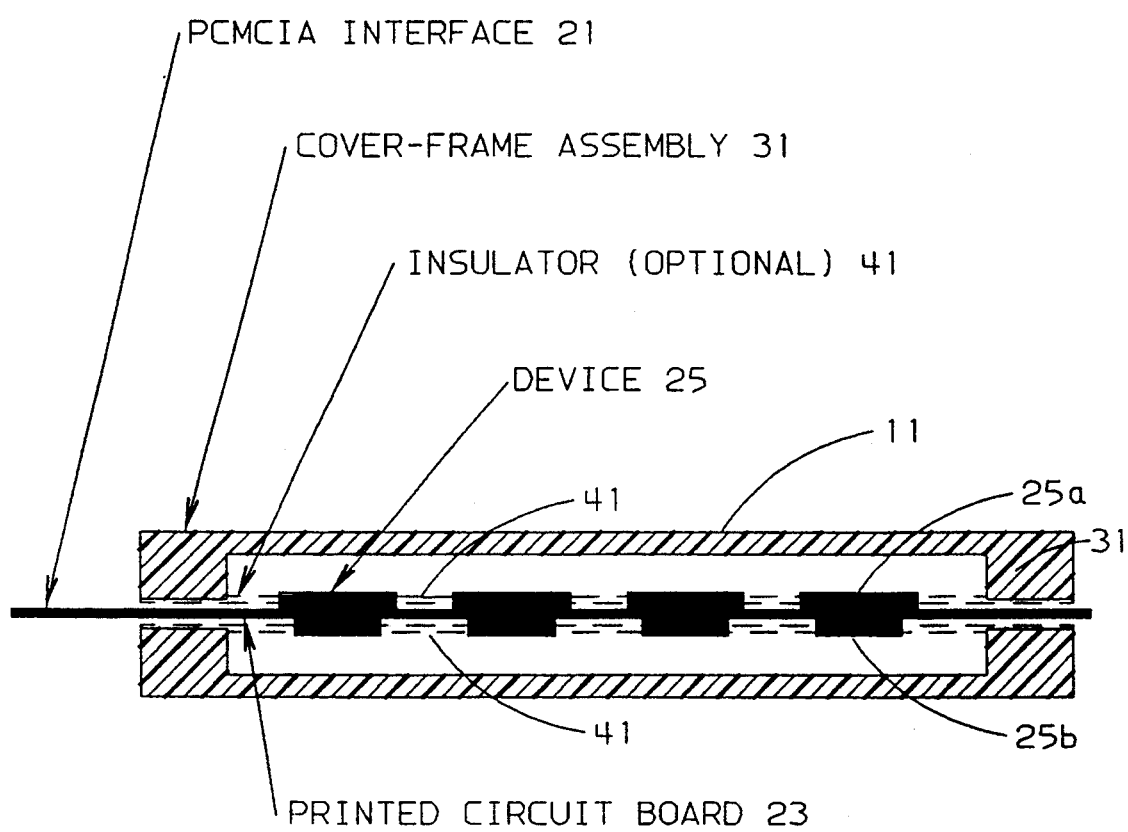
FIG. 3 is a cutaway side elevation of a PCMCIA card showing the PCMCIA interface, the cover-frame assembly, an optional insulator, and a printed circuit board populated on both sides.
Figure 4:
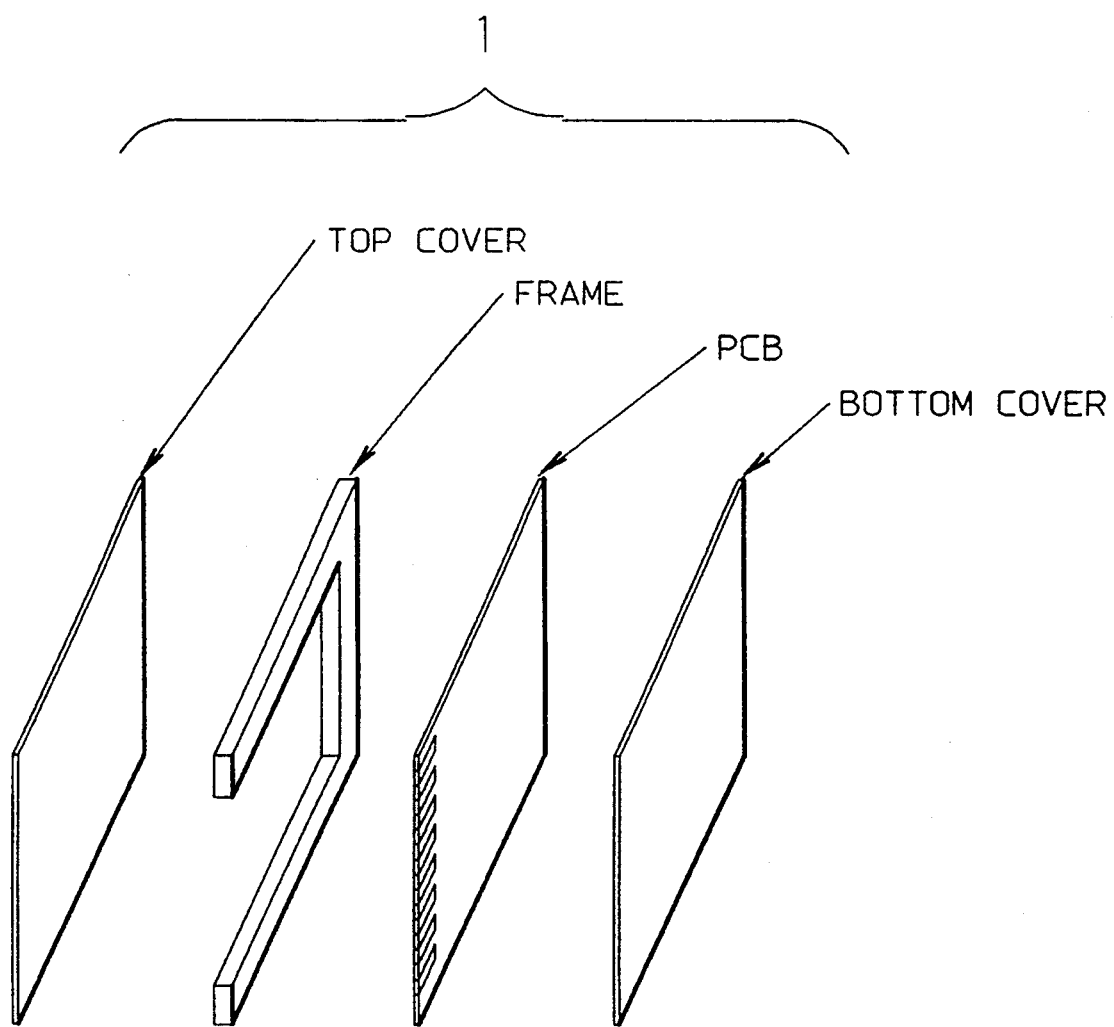
FIG. 4 shows an exploded view of a PCMCIA card with the top cover, the frame, the printed circuit board, and the bottom cover.
Figure 5:
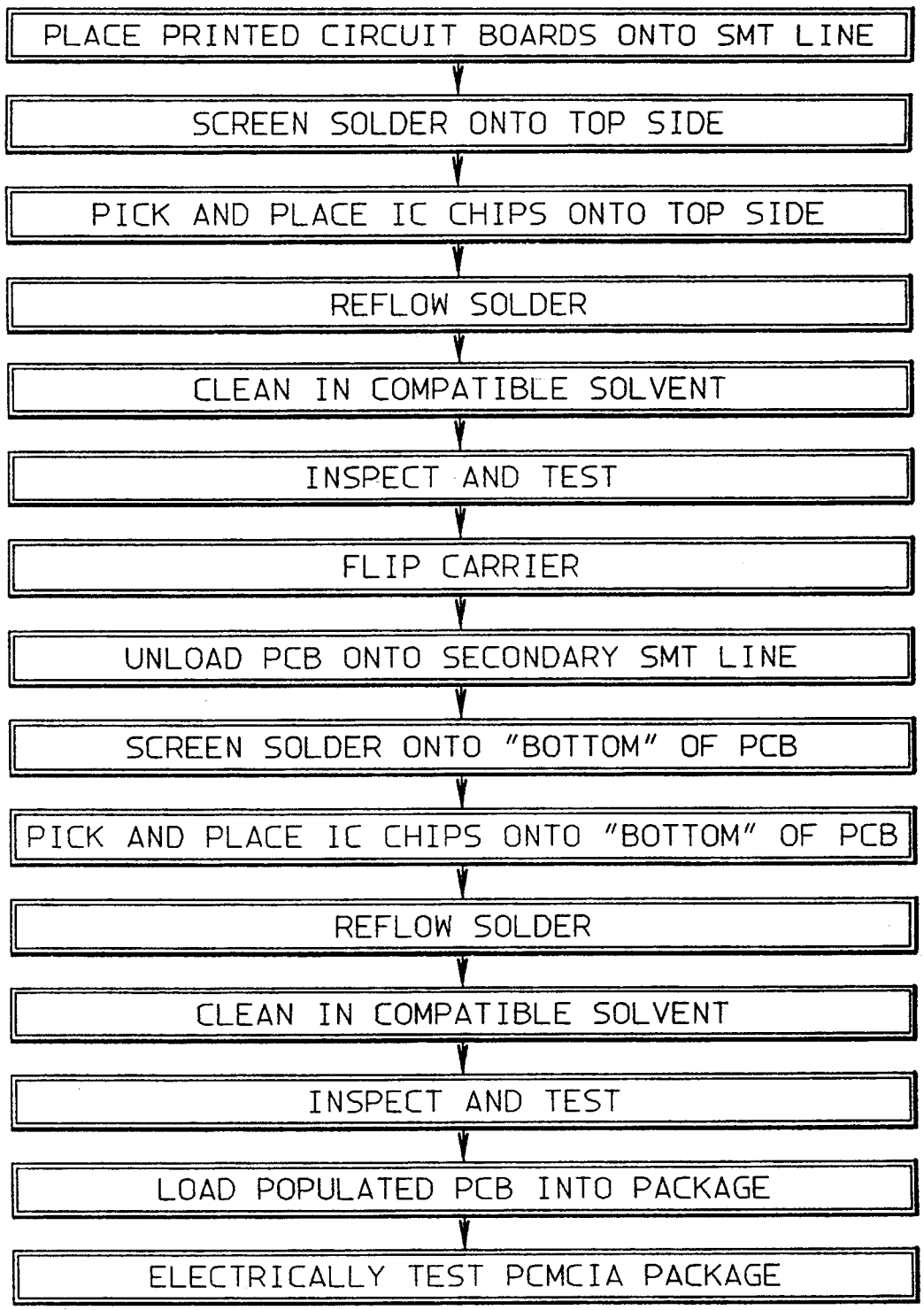
FIG. 5 shows a flow chart for fabrication of a PCMCIA card with both sides of the printed circuit card populated.
Figure 6:
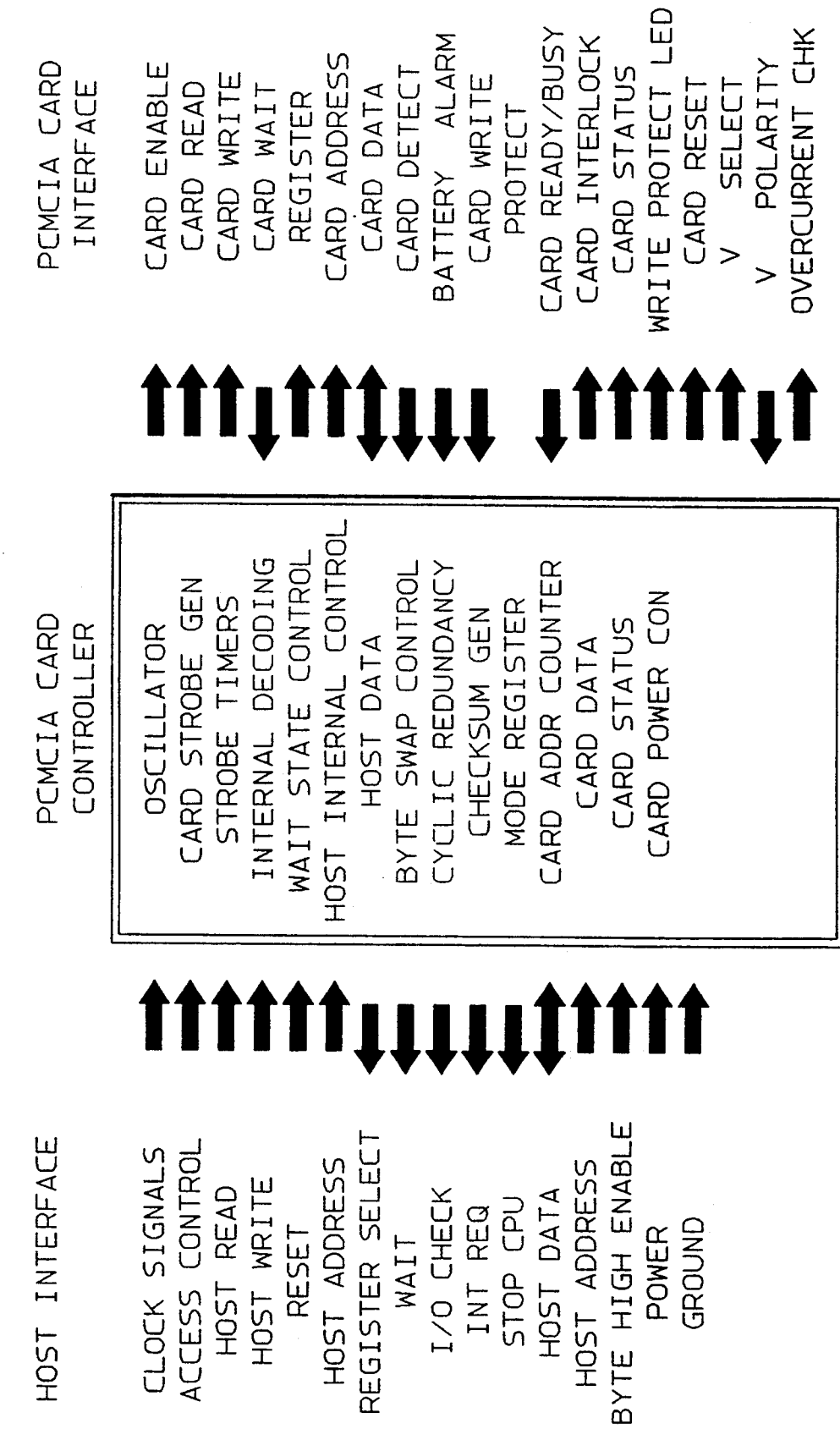
FIG. 6 shows the protocol for a PCMCIA interface.
Figure 7:
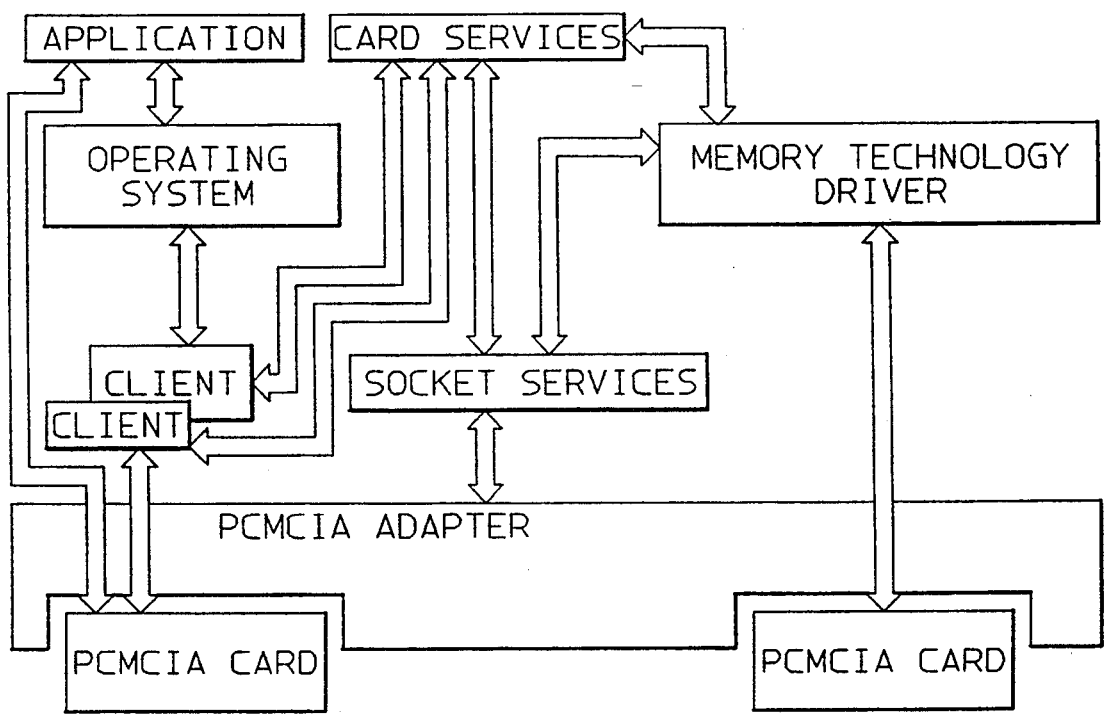
FIG. 7 shows the protocol for the PCMCIA software interface.

The small size and high circuit density of PCMCIA-type cards requires extreme care to avoid the warpage and misalignment normally associated with the thermal expansion of manufacturing thermal processes as heating a printed circuit board 23 from ambient temperature to the reflow temperature of the solder. This is especially severe with a printed circuit board 23 having both surfaces thereof populated as shown in FIG. 3, and therefore having two reflow steps including two heating and cooling steps, as is normally the case with a hierarchal solder metallurgy pair.

Figure 8:
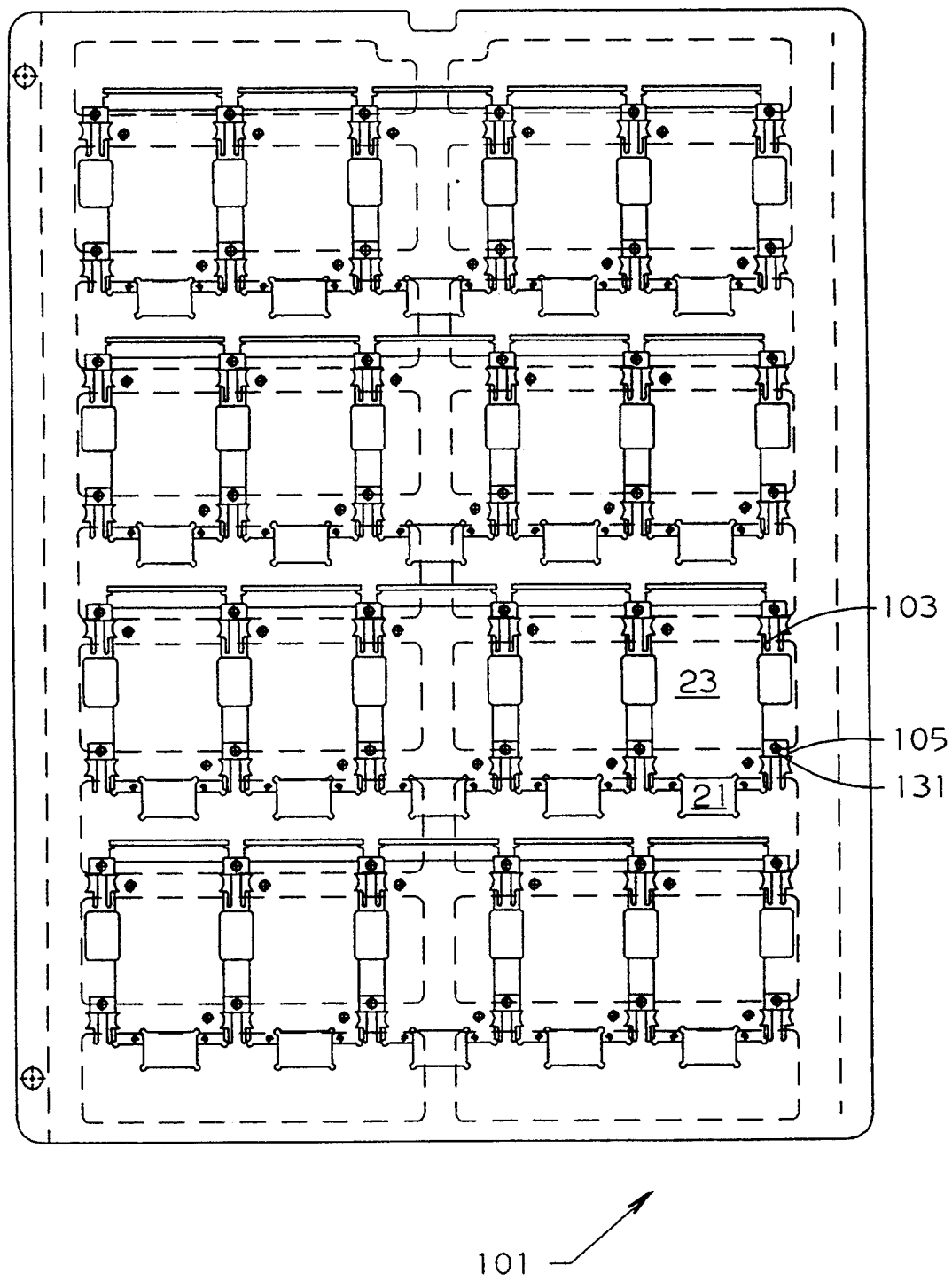
FIG. 8 is a plan view of a work board holder of the invention.
Figure 9:
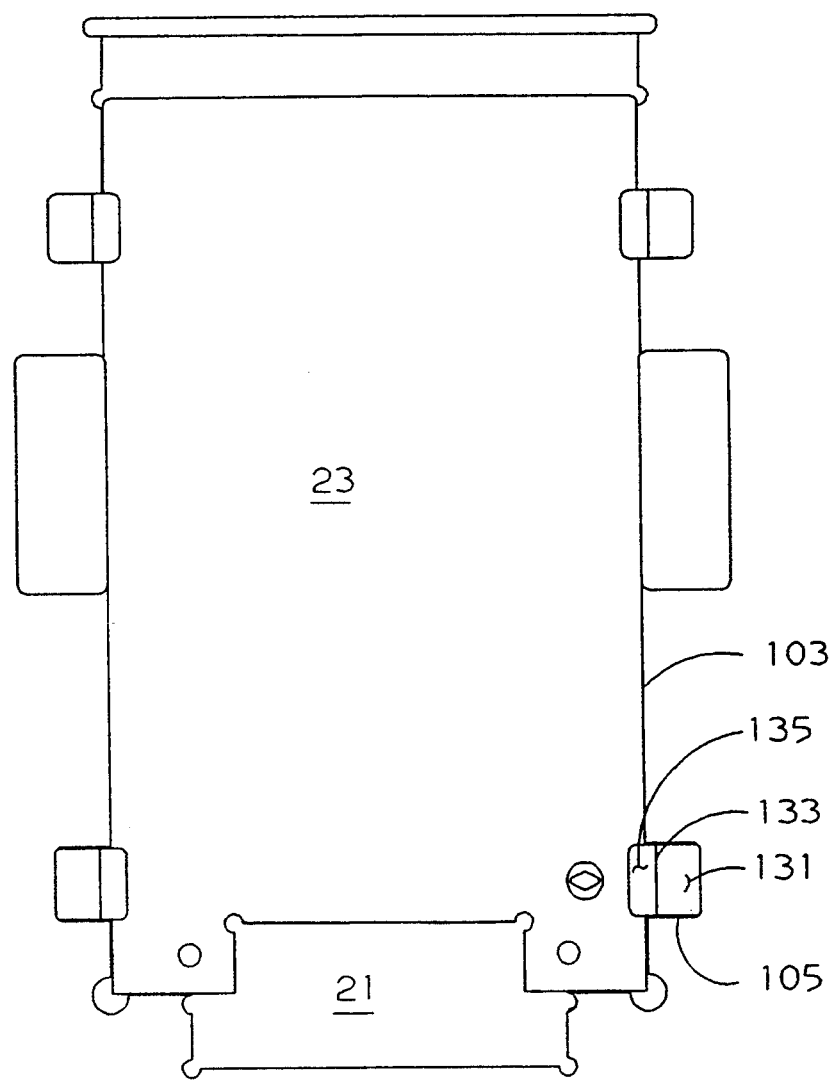
FIG. 9 is a detailed view of the aperture and the hold down clips for one printed circuit board of the work board holder of the invention.
Figure 10:
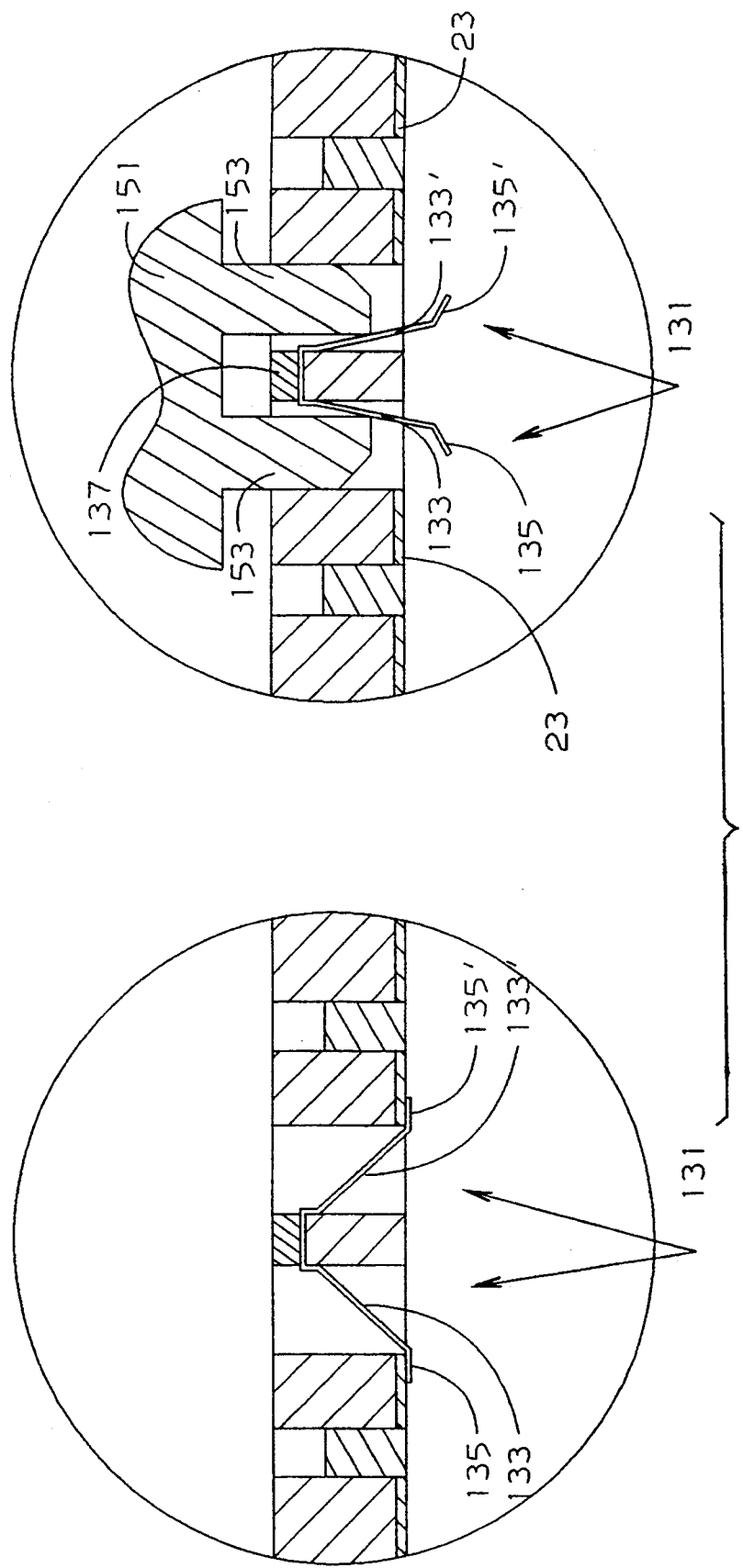
FIG. 10 is a cutaway elevation of the work board holder showing the clamp means and loading fixture of the invention.
Figure 11:
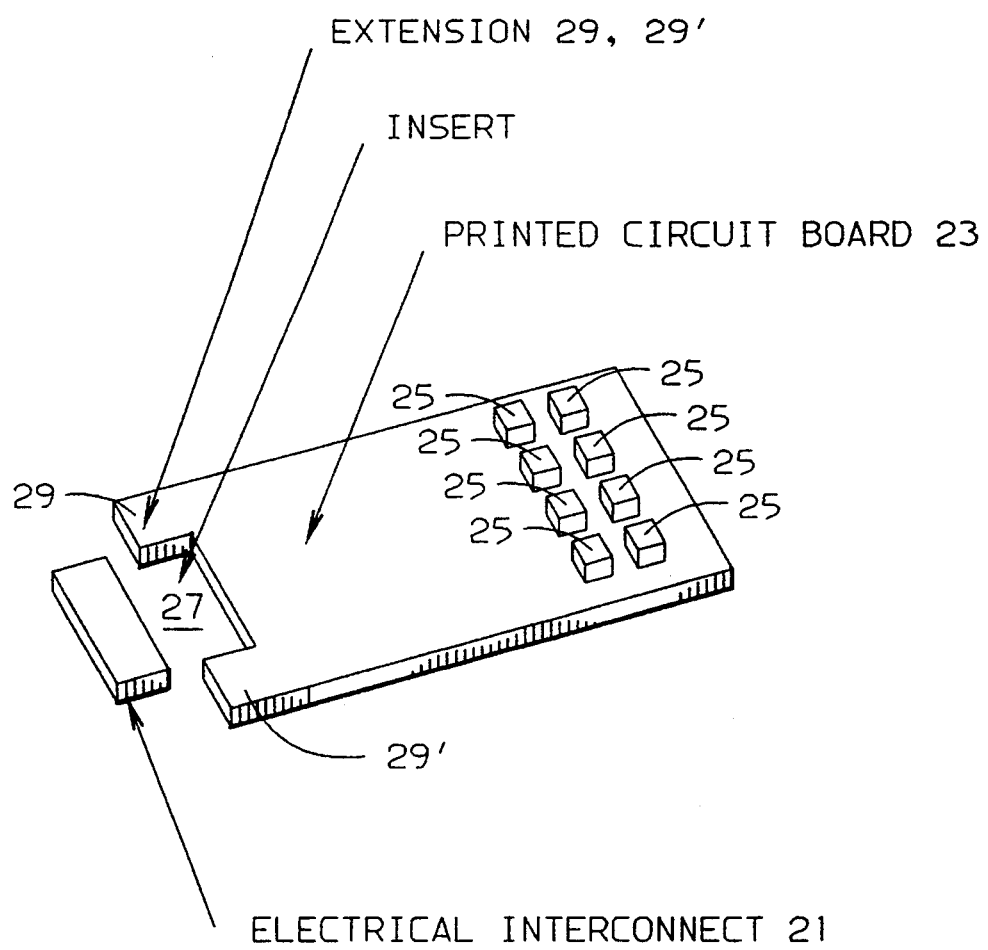
FIG. 11 is a plan view of a raw card, with the extensions and insert, and the interconnection interface.

According to the method and apparatus of the invention, the thermally induced warpage and misalignment is significantly reduced and even eliminated if the manufacturing jig, i.e., the work board holder 101, of FIGS. 8, 9, and 10, is thermally matched to the printed circuit boards 23. That is, according to the invention the coefficients of thermal expansion of the printed circuit board 23 and of the work board holder 101 are substantially equal, or differ from one another by an amount that is insignificant within normal manufacturing tolerances. This is typically on the order of about $$-15\% \leq 100 \times (CTE_1 - CTE_2)/[(0.5)(CTE_1 + CTE_2)] \leq +15\%.$$

Thus, according to the method of the invention there is provided a parallel processing method of substantially simultaneously populating a plurality of printed circuit boards 23 with surface mount technology devices 25. This is carried out utilizing a multi-board work board holder 101, so that a plurality of individual printed circuit boards 23 can be parallel processed.

Initially a plurality of printed circuit boards 23 are placed into a multi-board work board holder 101. The work board holder 101 has a plurality of apertures 103 corresponding to the plurality of printed circuit boards 23. That is, there is one aperture 103 approximately the same size and shape as each printed circuit board 23 (including the interconnect 21) for holding the printed circuit board 23 and interconnect 21 therein through the manufacturing process. These manufacturing processes include position sensitive steps such as precise placement of solder paste on pads and the subsequent placement of SMT IC chips 25 on the solder paste, as well as one or more heating and cooling steps. Thus, rigidity down to solder placement and chip 25 placement tolerances must be established and maintained through one or more solder reflow cycles.

After placing the plurality of raw, unpopulated printed circuit boards 23 into the multi-board work board holder 101 the multi-board work board holder 101 is started through a surface mount technology line. The first step in the surface mount technology line is selectively applying solder paste onto the contact pads on the surfaces of each of the printed circuit boards 23. The solder paste is a mixture of solder particles, flux, flux activators, and a carrier. The carrier is a thixotrope that becomes more flowable under an applied pressure.

Typically solder application is done through a stencil or a screen, or by dispensing through sub-millimeter extruders. The contacts and pads typically have a size of about 0.2794 mm by 1.78 mm, and the screen mesh, when a screen is used, is about 457.2 mm by 660.4 mm by 0.1524 mm, with an aperture size of about 0.254 mm by 1.78 mm. The screen can be in contact with the printed circuit boards 23, or spaced therefrom, but it is most commonly in contact with the printed circuit boards 23. In a preferred embodiment stenciling of a high viscosity, high solids content solder paste is utilized.

Next the integrated circuit chips 25 are placed onto the solder paste bearing surface of the printed circuit boards 23, with the contact leads of the integrated circuit chips 25 bearing on the deposited solder paste. This requires selection of the IC chips 25, and precise orientation and placement of the individual chips 25 with respect to the solder deposits on the individual cards 23. This is typically carried out by sequential machines, where the integrated circuit chips 25 are typically supplied by a reel and tape system, although a pick and place system can be utilized, or, alternatively, a robotic system with machine vision may be used. The solder paste can be relied upon as an adhesive, or a separate adhesive can be used.

After placing the integrated circuit chips 25, the printed circuit boards 23 and the work board holder are heated from ambient temperature to the reflow temperature of the solder. Heating can be ramped, or multistaged, for example, to evaporate carrier volatiles without boil-off. Heating to reflow causes the solder in the solder paste to flow and provide electrical and mechanical connection between the integrated circuit chips 25 and the printed circuit boards. Heating can be by convection from heated gases, such as nitrogen or air, by conduction, by radiation, or by some combination thereof.

A secondary or side effect of reflow heating can be the above described warpage or misalignment of the individual printed circuit boards. The warpage or misalignment is especially severe in the case of double sided cards which have hierarchal soldering metallurgies, and go through sequential reflow steps.

The reflow step is followed by a cooling step, which cools the printed circuit boards 23 and the multi-board work board holder 101 from the reflow temperature of the solder to ambient temperature or to whatever temperature is used for cleaning the solder paste residue from the printed circuit boards. This is both a mechanical stress and a thermal stress.

After cleaning, if performed, for example, with an aqueous or organic solvent, and with spray or with ultrasonic agitation, the now populated printed circuit boards 23 can be electrically and/or logically tested. This may, also be carried out at elevated temperature. Testing is, at a minimum, for shorts, opens, and reversed polarity devices. Testing can be carried out on a "bed of nails" tester. Similarly, in-circuit testers and functional testers can be utilized.

The populated printed circuit boards 23 are removed from the multi-board work board holder 101, or they may be reinserted for the bottom surface to be populated.

According to our invention the coefficients of thermal expansion of the printed circuit board and the work board holder are matched. That is, the x-y plane and z axis coefficients of thermal expansion of the multi-board work board holder 101 are matched to the x-y plane and z-axis coefficients of thermal expansion of the printed circuit boards. This avoids warpage and misalignment of the printed circuit boards.

The materials used to fabricate the printed circuit boards 23 and the work board holders 101 determine the magnitude of the coefficients of thermal expansion. For example, the x-y plane coefficients of thermal expansion of the printed circuit boards 23 and of the multi-board work board holders 101 can be matched to about $16 \times 10^{-6}$ to $20 \times 10^{-6}$ per degree Celsius and the z axis coefficients of thermal expansion of the printed circuit boards 23 and of the multi-board work board holders 101 are matched to about $50 \times 10^{-6}$ to $60 \times 10^{-6}$ per degree Celsius when the materials of construction of the printed circuit is epoxy glass cloth, and the work board holder is the same or a thermally compatible material.

Most commonly the epoxy glass cloth printed circuit boards 23 and the multi-board work board holders 101 are the same material, and this material is a polymer of:

a. diglycidyl ethers of bisphenol-A and tetrabromobisphenol-A with a bromine content, basis total bisphenol-A and tetrabromobisphenol-A, of about 15 to 20 weight percent; and b. about 10 to 20 weight percent epoxy novolac resin cross-linking agent, basis total diglycidyl ether and epoxy novolac resin.

The above described diglycidyl ether-epoxy novolac resins may be filled with suitable fillers, for example to control or tailor the coefficients of thermal expansion, or to control or tailor the dielectric constant. Exemplary fillers include particulate fillers, such as those chosen from the group consisting of silica, clay, calcium carbonate, glass fibers, glass bead, and carbon. The fillers may be further characterized as particulate spherical ceramics having a particle size of from about 10 microns to about 300 microns, and alternatively as constituting about 30 to about 60 weight percent particulate spherical ceramic in the composite material.

Alternatively the x-y plane coefficients of thermal expansion of the printed circuit boards 23 and of the multi-board work board holders 101 are matched to about $55 \times 10^{-6}$ to $75 \times 10^{-6}$ per degree Celsius and the z axis coefficients of thermal expansion of the printed circuit boards 23 and of the multi-board work board holders 101 are matched to about $75 \times 10^{-6}$ to $85 \times 10^{-6}$ per degree Celsius, for example where the printed circuit boards 23 and the multi-board work board holders 101 comprise a major portion of polytetrafluoroethylene as the structurally significant or primary polymeric material.

Alternatively, the x-y plane coefficients of thermal expansion of the printed circuit boards 23 and of the multi-board work board holders 101 can be matched to about $5 \times 10^{-6}$ to $20 \times 10^{-6}$ per degree Celsius and the z axis coefficients of thermal expansion of the printed circuit boards 23 and of the multi-board work board holders 101 are matched to about $5 \times 10^{-6}$ to $20 \times 10^{-6}$ per degree Celsius. This is the case where the polymeric material is filled poly tetrafluoroethylene. Exemplary fillers are particulate fillers, such as those chosen from the group consisting of silica, clay, calcium carbonate, glass fibers, glass bead, and carbon. The fillers may be further characterized as particulate spherical ceramics having a particle size of from about 10 microns to about 300 microns, and alternatively as constituting about 30 to about 60 weight percent particulate spherical ceramic in the composite material.

Thus, in a preferred exemplification the materials of construction of the printed circuit boards 23 and of the work board holder 101 are the same material. In an alternative exemplification the work board holder is fabricated of a material having a coefficient of thermal expansion with plus or minus 15 percent of the material of construction of the printed circuit board 23 or card 25. That is, $$-15\% \leq 100 \times (CTE_1 - CTE_2)/[(0.5)(CTE_1 + CTE_2)] \leq +15\%.$$

where $CTE_1$ is the coefficient of thermal expansion of the printed circuit board or card substrate material and $CTE_2$ is the coefficient of thermal expansion of the multi-card work board holder material.

The work board holder 101 can be fabricated of the same material as the printed circuit board 23 substrate material, or it can be fabricated of another material matched thereto in Coefficient of Thermal Expansion, as defined above.

In a particularly preferred exemplification the material used in fabricating the printed circuit board substrate is an epoxy glass cloth where the epoxy is a polymer of:

a. diglycidyl ethers of bisphenol-A and tetrabromobisphenol-A with a bromine content, basis total bisphenol-A and tetrabromobisphenol-A, of about 15 to 20 weight percent; and b. about 10 to 20 weight percent epoxy novolac resin cross-linking agent, basis total diglycidyl ether and epoxy novolac resin.

The multi-card work board holder 101 can then be fabricated of the same material, or of such thermally matched materials as phenolics, epoxy based materials, modified epoxies, or polyimides. In a further embodiment, the multi-card work board holder can be fabricated of a diglycidyl ether-epoxy novolac resin, a phenolic, an epoxy based material, a modified epoxy, or a polyimide that has been filled with particulate fillers, such as those chosen from the group consisting of silica, clay, calcium carbonate, glass fibers, glass bead, and carbon. The fillers may be further characterized as particulate spherical ceramics having a particle size of from about 10 microns to about 300 microns, and alternatively as constituting about 30 to about 60 weight percent particulate spherical ceramic in the composite material.

In an alternative exemplification the materials of construction of the printed circuit boards 23 are polytetrafluoroethylene filed with particulate fillers, such as those chosen from the group consisting of silica, clay, calcium carbonate, glass fibers, glass bead, and carbon. The fillers may be further characterized as particulate spherical ceramics having a particle size of from about 10 microns to about 300 microns, and alternatively as constituting about 30 to about 60 weight percent particulate spherical ceramic in the composite material. The multi-card work board holder 101 can then be fabricated of the same material, or of such thermally matched materials as phenolics, epoxies, modified epoxies, and polyimides.

Alignment and Retention Clips for Use During Thermal Processing

A further aspect of thermal management is rigidly holding the printed circuit boards 23 in the multi-board work holder 101 during such sensitive operations as solder paste application and integrated circuit chip 25 placement, and maintaining the integrated circuit chips 25 in position during reflow, cooling, cleaning, and further processing. This is done by the combination of the thermal expansion coefficient matching described hereinabove, and a positive mechanical latching system that is compatible with high volume, high throughput manufacturing.

Thus, according to this embodiment of our invention there is provided a multi-board work board holder 101 system shown in FIGS. 8, 9, and 10. The components of the system are (a) a work board holder 101, (b) a loading fixture 151 for placing a printed circuit board 23 in a lockable position in the work board holder 101, and (c) a locking means 131 for locking printed circuit boards 23 in the work board holder 101.

The multi-board work board holder 101 has first apertures 103 therein corresponding to in-process printed circuit boards 23 and second apertures 105 cooperatively arrayed with plug extensions 153 of the locking fixture 151 and corresponding to the locking clamp 131.

The locking means or clamp 131 includes resilient spring members 131. The resilient spring members 131 have a "V" shape, as shown in FIG. 10. The sides, 133, 133', of the "V" shaped clamp 131 extend upwardly through the locking apertures 105 of the work board holder 101. The sides, 133, 133', of the "V" shaped clamp 131 are further characterized by obtuse angle extensions, 135, 135', on the upper ends 133, 133' of the "V" 131 as shown in FIG. 10. The obtuse angle extensions, 135, 135', are substantially parallel to the work board holder 101 when the "V" 131 is normally expanded and form an angle with the work board holder 101 when the "V" 131 is compressed. The locking clamp 131 has an aperture 137 on the lower end of the "V" 131 for movably engaging one of the plug extensions 153 of the workboard holder 101.

The locking fixture clamp 153 has a plate or base 155 having finger like extensions 153 corresponding to the aperture 137 in the locking or clamping "V" 131. These fingers 153 are adapted to compress the sides, 133, 133', of "V" 131 and lift the extensions, 135, 135', of the "V" 131 when engaged and to allow expansion of the sides, 133, 133', of the "V" 131 and allow contact of the extensions, 135, 135', of the "V" with the surface of the work board holder 101 or the inserted printed circuit board 23 when disengaged from the fingers 153.

The above described structure further reduces the tendency for thermally induced warpage and misalignment.

Thermal Fitting of The Electrical Interconnection

The positioning of the electrical interconnection interface 21 of FIGS. 1 to 4 and 11 is a critical manufacturing step in the fabrication of the printed circuit boards 23 of the invention. This is because the interconnection 21 is not an extension of the printed circuit board 23, but is a separate structure, formed of a relatively high coefficient of thermal expansion electrical connector interface material and joined to a relatively low coefficient of thermal expansion printed circuit board 23. The alignment of the sixty eight circuitization lines, each about 0.500 mm wide, and spaced 1.27 mm apart (center to center) is particularly critical.

Thus, according to the method of the invention, which includes the steps of selectively applying solder paste onto contact pads on a surface of the printed circuit board 23, placing integrated circuit chips 25 onto the solder paste bearing surface of the printed circuit board 23, with contact leads of the integrated circuit chips 25 bearing on deposited solder paste, heating the printed circuit board 23 from ambient temperature to the reflow temperature of the solder to reflow the solder in the solder paste and provide electrical and mechanical connection between the integrated circuit chips 25 and the printed circuit boards 23, the installation of the interface interconnection is particularly critical, inasmuch as the materials are thermally mismatched.

According to the method of the invention the printed circuit board 23 has an insert 29 defined by extensions 27, 27' of the printed circuit board 23 material. This insert 29 is wider then the relatively high coefficient of thermal expansion electrical connector interface 21. The relatively high coefficient of thermal expansion electrical connector interface 21 is placed in the insert 29 between the extensions 29, 29' of the printed circuit board material. That is, the insert 29 is in and is defined by the relatively low coefficient of thermal expansion printed circuit board 23.

The printed circuit board 23 and connector 21 are then heated from ambient temperature to the reflow temperature of the solder to reflow the solder in the solder paste, provide electrical and mechanical connection between the integrated circuit chips 25 and the printed circuit boards 23, and expand the relatively high coefficient of thermal expansion electrical connector interface 21. This interface 21 expands to a greater extent then the relatively low coefficient of thermal expansion printed circuit board 23. This results in a thermal expansion fit of the electrical connector interface 21 to the printed circuit board 23.

The coefficient of thermal expansion of the electrical connector interface, 21 is about $50 \times 10^{-6}$ to about $70 \times 10^{-6}$ per degree Celsius, and the coefficient of thermal expansion of the printed circuit board 23 is about $16 \times 10^{-6}$ to about $20 \times 10^{-6}$ per degree Celsius in the case of an epoxy-glass printed circuit board.

While the invention has been described with respect to certain preferred embodiments and exemplifications, it is not intended to limit the scope of the invention thereby, but solely by the claims appended hereto.

We claim:

1. In a method of populating a plurality of printed circuit boards with surface mount technology devices in a multi-board work board holder, comprising the steps of:
   a. placing the plurality of printed circuit boards into a multi-board work board holder, said work board holder having a plurality of apertures corresponding to the plurality of printed circuit boards;
   b. placing the multi-board Work board holder onto a surface mount technology line;
   c. selectively applying solder paste onto contact pads on surfaces of the printed circuit boards;
   d. placing integrated circuit chips onto the solder paste bearing surface of the printed circuit boards, with contacts leads of the integrated circuit chips bearing on deposited solder paste;
   e. heating the printed circuit boards and the work board holder from ambient temperature to the reflow temperature of the solder to reflow the solder in the solder paste and provide electrical and mechanical connection between the integrated circuit chips and the printed circuit boards;
   f. cooling the printed circuit boards and the multi-board work board holder from the reflow temperature of the solder; and
   g. removing the populated printed circuit boards from the multi-board work board holder;
the improvement wherein the x-y plane and z axis coefficients of thermal expansion of the multi-board work board holder are matched to the x-y plane and z-axis coefficients of thermal expansion of the printed circuit boards to avoid warpage and misalignment of the printed circuit boards.

2. The method of claim 1 wherein the x-y plane coefficients of thermal expansion of the printed circuit boards and of the multi-board work board holders are matched to about $16 \times 10^{-6}$ to $20 \times 10^{-6}$ per degree Celsius and the z axis coefficients of thermal expansion of the printed circuit boards and of the multi-board work board holders are matched to about $50 \times 10^{-6}$ to $60 \times 10^{-6}$ per degree Celsius.

3. The method of claim 2 wherein the printed circuit boards and the multi-board work board holders comprise epoxy glass cloth.

4. The method of claim 3 wherein the epoxy glass cloth printed circuit boards and the multi-board work board holders comprise a polymer of:
   a. diglycidyl ethers of bisphenol-A and tetrabromobisphenol-A with a bromine content, basis total bisphenol-A and tetrabromobisphenol-A, of about 15 to 20 weight percent; and
   b. about 10 to 20 weight percent epoxy novolac resin cross-linking agent, basis total diglycidyl ether and epoxy novolac resin.

5. The method of claim 1 wherein the printed circuit boards and the multi-board work board holders each comprise a polymeric material chosen from phenolics, epoxies, modified epoxies, and polyimides.

6. The method of claim 5 wherein the filler is chosen from the group consisting of silica, clay, calcium carbonate, glass fibers, glass bead, and carbon.

7. The method of claim 1 wherein the polymer-filler composite comprises from about 30 to about 60 weight percent filler.

8. The method of claim 1 wherein the x-y plane coefficients of thermal expansion of the printed circuit boards and of the multi-board work board holders are matched to about $55 \times 10^{-6}$ to $75 \times 10^{-6}$ per degree Celsius and the z axis coefficients of thermal expansion of the printed circuit boards and of the multi-board work board holders are matched to about $75 \times 10^{-6}$ to $85 \times 10^{-6}$ per degree Celsius.

9. The method of claim 8 wherein the printed circuit boards and the multi-board work board holders comprise polytetrafluoroethylene.

10. The method of claim 1 wherein the x-y plane coefficients of thermal expansion of the printed circuit boards and of the multi-board work board holders are matched to about $5 \times 10^{-6}$ to $20 \times 10^{-6}$ per degree Celsius and the z axis coefficients of thermal expansion of the printed circuit boards and of the multi-board work board holders are matched to about $5 \times 10^{-6}$ to $20 \times 10^{-6}$ per degree Celsius.

11. The method of claim 10 wherein the printed circuit boards and the multi-board work board holders comprise filled polytetrafluoroethylene.

12. The method of claim 11 wherein the filler comprises a particulate ceramic chosen from the group consisting of silica, clay, calcium carbonate, glass fibers, glass bead, and carbon.

13. The method of claim 11 wherein the filler comprises a particulate spherical ceramic having a particle size of from about 10 microns to about 300 microns.

14. The method of claim 11 wherein the polymer-filler composite comprises about 30 to about 60 weight percent of a particulate spherical ceramic.

15. A method of attaching a relatively high coefficient of thermal expansion electrical connector interface to a relatively low coefficient of thermal expansion printed circuit board, including the steps of selectively applying solder paste onto contact pads on a surface Of the printed circuit board, placing integrated circuit chips onto the solder paste bearing surface of the printed circuit board, with contact leads of the integrated circuit chips bearing on deposited solder paste, heating the printed circuit board from ambient temperature to the reflow temperature of the solder to reflow the solder in the solder paste and provide electrical and mechanical connection between the integrated circuit chips and the printed circuit boards, the method of interface attachment comprising:
   a. providing an insert defined by extensions of the printed circuit board material in the relatively low coefficient of thermal expansion printed circuit board, said insert being wider then the relatively high coefficient of thermal expansion electrical connector interface;
   b. positioning the relatively high coefficient of thermal expansion electrical connector interface in the insert between the extensions of the printed circuit board material in the relatively low coefficient of thermal expansion printed circuit board; and
   c. heating the printed circuit board from ambient temperature to the reflow temperature of the solder to reflow the solder in the solder paste, provide electrical and mechanical connection between the integrated circuit chips and the printed circuit boards, and expand the relatively high coefficient of thermal expansion electrical connector interface to a greater extent then the relatively low coefficient of thermal expansion printed circuit board to thermal expansion fit the electrical connector interface to the printed circuit board.

* * * * *